US008780006B2

(12) United States Patent
Chang et al.

(10) Patent No.: US 8,780,006 B2
(45) Date of Patent: *Jul. 15, 2014

(54) ANTENNA MATCHING CIRCUIT CONTROL DEVICE

(71) Applicant: ASUSTeK Computer Inc., Taipei (TW)

(72) Inventors: Chia-Hao Chang, Taipei (TW); Meng-Huan Wu, Taipei (TW); Kuo-Chu Liao, Taipei (TW)

(73) Assignee: ASUSTeK Computer Inc., Taipei (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/019,349

(22) Filed: Sep. 5, 2013

(65) Prior Publication Data
US 2014/0002324 A1 Jan. 2, 2014

Related U.S. Application Data

(63) Continuation of application No. 13/236,033, filed on Sep. 19, 2011, now Pat. No. 8,570,236.

(60) Provisional application No. 61/387,476, filed on Sep. 29, 2010.

(51) Int. Cl.
H01Q 1/50 (2006.01)
(52) U.S. Cl.
USPC .......................................... 343/860; 343/850
(58) Field of Classification Search
USPC ........................... 343/850, 860, 852, 861, 702
See application file for complete search history.

(56) References Cited

U.S. PATENT DOCUMENTS

| 6,885,353 | B2* | 4/2005 | Kurihara | 343/860 |
| 7,454,227 | B2 | 11/2008 | Kitaji | |
| 8,200,168 | B2* | 6/2012 | Rofougaran et al. | 455/80 |
| 8,570,236 | B2* | 10/2013 | Chang et al. | 343/860 |
| 2005/0035921 | A1 | 2/2005 | Huang et al. | |
| 2005/0195121 | A1 | 9/2005 | Paek | |
| 2011/0012792 | A1 | 1/2011 | Krenz et al. | |

FOREIGN PATENT DOCUMENTS

| CN | 101540621 | 9/2009 |
| JP | 2008288699 | 11/2008 |
| KR | 20070033509 | 3/2007 |

* cited by examiner

Primary Examiner — Hoanganh Le
(74) Attorney, Agent, or Firm — Muncy, Geissler, Olds & Lowe, P.C.

(57) ABSTRACT

The antenna matching circuit control device with an antenna body includes a sensing module, a processing module, a power adjusting module and a frequency adjusting module. The sensing module senses an object that approaches the antenna body and outputs a sensing signal accordingly. The processing module is coupled to the sensing module and outputs a first control signal and a second control signal according to the sensing signal. The power adjusting module is coupled to the processing module and controls a power amplifier to couple with one of a plurality of first matching circuits according to the first control signal. The frequency adjusting module is coupled to the antenna body and the power adjusting module. The frequency adjusting module controls one of a plurality of second matching circuits to couple with one of the first matching circuits according to the second control signal.

11 Claims, 3 Drawing Sheets

ANTENNA MATCHING CIRCUIT CONTROL DEVICE

CROSS REFERENCE TO RELATED APPLICATIONS

This non-provisional application is a continuation application of an earlier filed, pending, application, having application Ser. No. 13/236,033 and filed on Sep. 19, 2011, the content of which, including drawings, is expressly incorporated by reference herein.

BACKGROUND OF THE INVENTION

1. Field of Invention

The invention relates to an antenna matching circuit control device and, more particularly, to an antenna matching circuit control device applied to a wireless communication device.

2. Related Art

In consideration of consumers' health, every country limits an electromagnetic wave specific absorption rate (SAR, Specific absorption rate, is a measurement at which energy is absorbed by the body when exposed to a radio frequency (RF) electromagnetic field) of electromagnetic wave-emitting wireless communication device (such as a mobile phone or a tablet PC) in a safe range, so as to avoid harm from massive electromagnetic waves. The higher the SAR value is, the more serious potential harm to human body could be.

If the wireless communication device does not pass the electromagnetic wave SAR test or relevant safety inspection, it will not be legally sold or imported. As the wireless communication device becomes thinner, it is more difficult to reduce the electromagnetic wave SAR of which to meet the safety standard.

Moreover, when an object such as a human body approaches or contacts a casing of the wireless communication device, a coupling effect is generated and results in frequency drift of the antenna, which is called a body effect. The frequency drift of the antenna reduces a radiation efficiency of the antenna and affects the wireless communication quality. Consequently, to produce wireless communication devices, the electromagnetic wave SAR and the body effect on the communication quality should take into consideration.

SUMMARY OF THE INVENTION

An antenna matching circuit control device is disclosed. When the antenna matching circuit control device disclosed herein is applied to a wireless communication device, a body effect which reduce the communication quality is avoided, and the electromagnetic wave SAR effectively is also reduced. The antenna matching circuit control device cooperates with an antenna body.

The antenna matching circuit control device includes a sensing module, a processing module, a power adjusting module and a frequency adjusting module. The sensing module senses an object approaching the antenna body and outputs a sensing signal accordingly. The processing module is coupled to the sensing module and outputs a first control signal and a second control signal according to the sensing signal. Moreover, the process module may dynamically adjust the first control signal and second control signal through comparing a final strength of electromagnetic wave to a preset value, a feedback value or a calibration value.

The power adjusting module is coupled to the processing module and controls a power amplifier to couple with one of a plurality of first matching circuits according to the first control signal. The frequency adjusting module is coupled to the antenna body and the power adjusting module and controls one of a plurality of second matching circuits to couple with one of the first matching circuits according to the second control signal.

The processing module further includes a memory for memorizing the sensing signal, the first control signal and the second control signal. The processing module determines whether an object is a human body and a distance between the object and antenna body, via the sensing signal.

In an embodiment, the processing module further includes a baseband processor and a radio frequency (RF) processor. The baseband processor is coupled to the memory and outputs the first control signal and the second control signal according to a correspondence among the second sensing signal, the corresponding first control signal and the corresponding second control signal. The first control signal and the second control signal may be baseband signals. The RF processor is coupled to the baseband processor and the power amplifier. The RF processor receives and converts the baseband signal from the baseband processor to a RF signal, and transmits the RF signal to the power amplifier.

In an embodiment, the power adjusting module includes a power control unit coupled to the power amplifier, and the power control unit controls the power amplifier to be coupled to one of the first matching circuits according to the first control signal.

In an embodiment, the power control unit further includes a gain controller controlling gain of the power amplifier according to the first control signal.

In an embodiment, the antenna matching circuit control device further includes two control units disposed between the power amplifier and the first matching circuits and between the first matching circuits and the second matching circuits, respectively, to switch the first matching circuits and the second matching circuits.

In an embodiment, the power control unit further includes a matching controller controlling one of the control units to switch the first matching circuits according to the first control signal.

In an embodiment, the second control signal selectively switches the second matching circuits via one of the control units.

In an embodiment, the sensing module includes a first sensor and a second sensor. The first sensor is an infrared ray (IR) temperature detecting device, the second sensor is an optical sensor or a proximity sensor, and the first sensor and the second sensor may be disposed at a casing of an electronic device.

The sensing module disclosed above is used to sense an object approaches the antenna body, and the processing module is used to control the power adjusting module and the frequency adjusting module to reduce the electromagnetic wave SAR. The wireless communication device with the antenna matching circuit control device will keep in a good communication quality when it approaches or contacts the object. Further, when the wireless communication device moves away from the object, the output power of the power amplifier is restored and an operating frequency of the antenna body is maintained to avoid affecting the communication quality of the wireless communication device. Consequently, when the antenna matching circuit control device is applied to the wireless communication device, the body effect on the communication quality of the wireless communication device is avoided, and products can therefore be facilitated to pass the safety inspection of the electromagnetic wave SAR.

These and other features, aspects and advantages of the present invention will become better understood with regard to the following description, appended claims, and accompanying drawings.

DETAILED DESCRIPTION OF THE INVENTION

An antenna matching circuit control device is illustrated hereinafter with relating drawings, and the same symbols denote the same components.

Figure 1:
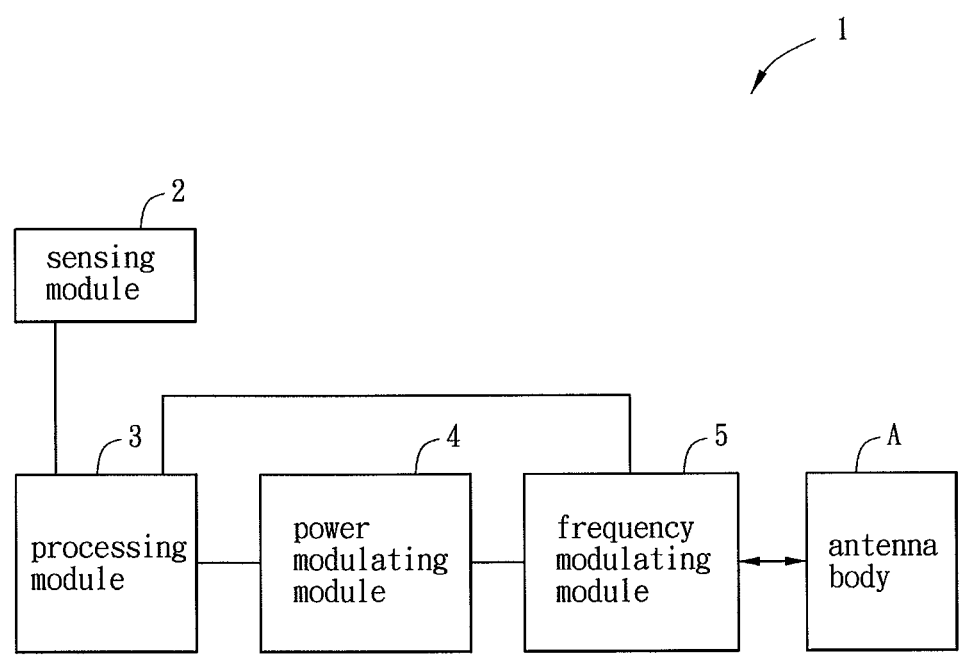
FIG. 1 is a block diagram showing architecture of a system of an antenna matching circuit control device in an embodiment.

FIG. 1 is a block diagram showing architecture of a system of an antenna matching circuit control device in an embodiment. The antenna matching circuit control device 1 cooperates with an antenna body A. The antenna matching circuit control device 1 includes a sensing module 2, a processing module 3, a power adjusting module 4 and a frequency adjusting module 5. The antenna matching circuit control device 1 may be applied to various wireless communication devices (not shown), such as a mobile phone, a tablet PC, a satellite navigator or other wireless communication devices.

Figure 2:
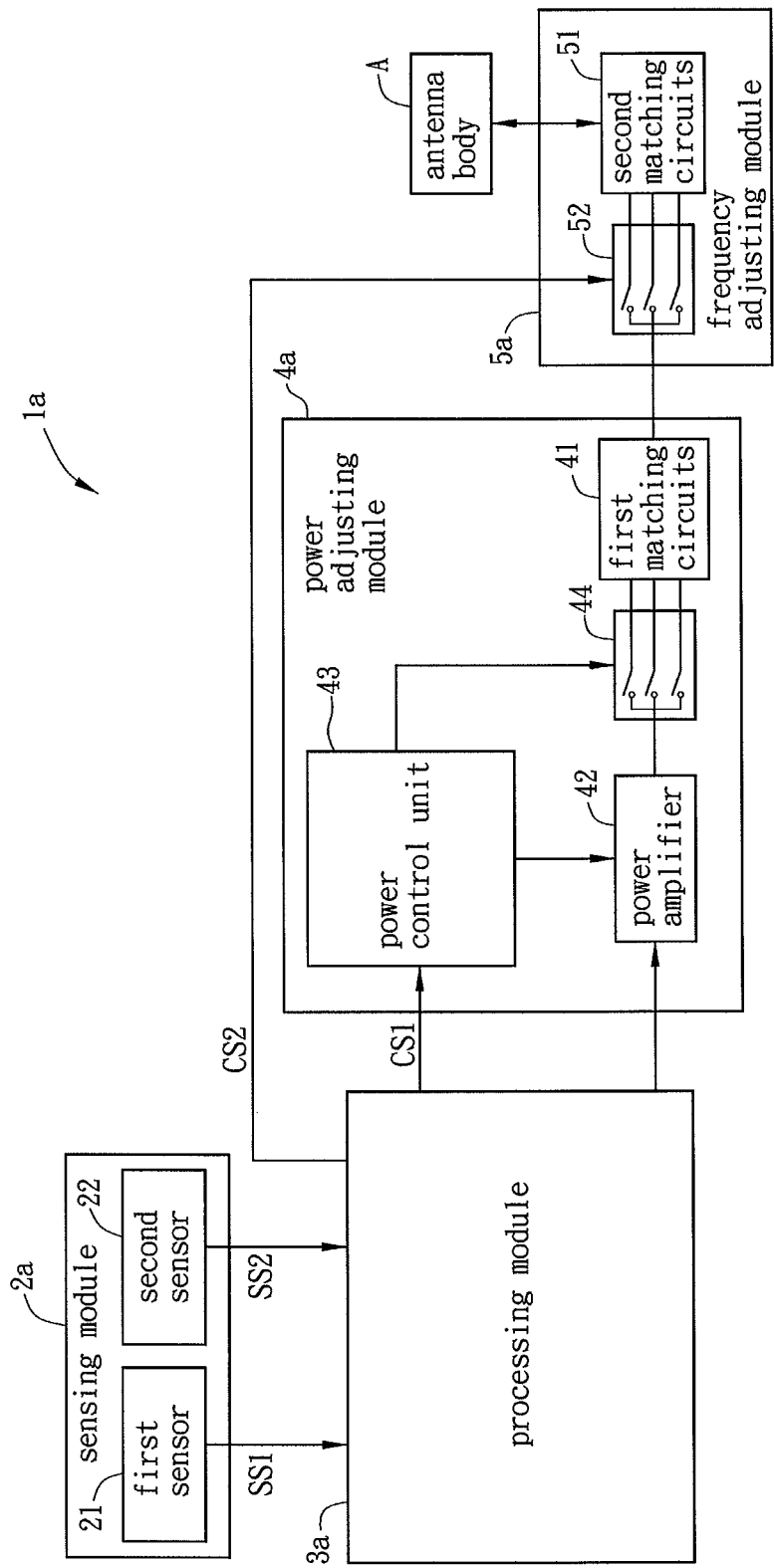
FIG. 2 is a block diagram showing a system of an antenna matching circuit control device in an embodiment.

FIG. 2 is a block diagram showing a system of an antenna matching circuit control device in an embodiment. A sensing module 2a of the antenna matching circuit control device 1a may be disposed at a casing (not shown) of an electronic device to sense if an object that approaches the antenna body A and the distance therebetween, then outputs a sensing signal accordingly. The sensing module 2a at least includes one sensor, and it also may include more sensors for reinforcing a sensing function. In the embodiment, the sensing module 2a with two sensors, a first sensor 21 and a second sensor 22, is taken as an example.

In more detailed, the first sensor 21 is used to sense an object that approaching the antenna body A and accordingly outputs a first sensing signal SS1 accordingly. The first sensor 21 may be an infrared ray (IR) temperature detecting device or other type of sensors, which is not limited herein. The second sensor 22 is used to sense a distance between the antenna body A and the object, and outputs a second sensing signal SS2 accordingly. The second sensor 22 may be an optical sensor, a proximity sensor or other type of sensors, which is not limiter herein. The first sensor 21 and the second sensor 22 may be independent disposed and also may be integrated together.

The processing module 3a is coupled to the first sensor 21, the second sensor 22 of the sensing module 2a and the power adjusting module 4a. The processing module 3a can be used for gathering, converting and processing signals and outputs a first control signal CS1 or a second control signal CS2 according to the first sensing signal SS1 or the second sensing signal SS2, respectively. Specifically, when determines that the object is a human body via the first sensing signal SS1, the processing module 3a outputs the first control signal CS1 and the second control signal CS2 according to the second sensing signal SS2. If the first sensor 21 senses that the object is not a human body, the processing module 3a does not output the first control signal CS1 and the second control signal CS2.

Moreover, the process module 3a may make a determination to output the first control signal CS1 and the second control signal CS2 through comparing the second sensing signal SS2 to a preset value, a feedback value defined according to actual communication state, or a calibration value after an actually measure of the electromagnetic wave SAR.

The power adjusting module 4a includes a plurality of first matching circuits 41, a power amplifier 42 and a power control unit 43. The power amplifier 42 is coupled to one of the first matching circuits 41, that is, the first matching circuits 41 are the matching circuits of the power amplifier 42.

The power control unit 43 is coupled to the power amplifier 42, controls the power amplifier 42 according to the first control signal CS1, and selectively controls the electrical connection between the first matching circuits 41 and the power amplifier 42. In detail, the power control unit 43 is coupled to the power amplifier 42, it controls the output of the power amplifier 42 according to the first control signal CS1 sent from the processing module 3a, and selectively controls the electrical connection between the first matching circuits 41 and the power amplifier 42 according to the first control signal CS1 to make the power amplifier 42 coupled to one of multiple first matching circuits 41, so as to change the output power of the power amplifier 42. When the object that is a part of human body and approaches or contacts the antenna body A, the power control unit 43 is used to reduce the emitting power of the power amplifier 42 to prevent the object from receiving massive electromagnetic wave energy.

The power amplifier 42 receives a RF signal from the processing module 3a, amplifies the RF signal according to the adjusted output power of the power control unit 43, and outputs the RF signal to a frequency adjusting module 5a.

The frequency adjusting module 5a is coupled to the antenna body A and the power adjusting module 4a. The frequency adjusting module 5a includes a second matching circuit 51. One end of the second matching circuits 51 is coupled to the antenna body A, and the other end is coupled to one of the first matching circuits 41. The processing module 3a uses the second control signal CS2 to selectively control the electrical connection between the second matching circuits 51 and one of the first matching circuits 41. The switch of the second matching circuits 51 compensates a frequency drift caused by the body effect when an object approaches the wireless communication device. Thus, the frequency of the antenna body A moves back to an initial central frequency, and the communication quality of the wireless communication device is not affected.

When the second sensor 22 senses that the object moves away from the antenna body A, the processing module 3a sends a first control signal CS1 and a second control signal CS2 to switch the first matching circuits 41 and the second matching circuits 51 back to increase the power of the power amplifier 42 and maintain the radiation efficiency of the antenna body A, and then the communication quality of the wireless communication device is restored.

As described above, the process module 3a outputs the first control signal CS1 and the second control signal CS2 to control a final output signal value. Through comparing the final output signal value to a preset value, a feedback value, or a calibration value, the first control signal CS1 and the second control signal CS2 is adjusted.

In the embodiment, the antenna matching circuit control device 1a may further include two control units 44 and 52. The control units 44 and 52 are disposed in the power adjusting module 4a and the frequency adjusting module 5a, respectively. The control unit 44 is disposed between the power amplifier 42 and the first matching circuits 41, and the control unit 52 is disposed between the first matching circuits 41 and the second matching circuits 51. The power control unit 43 uses the control unit 44 to switch one of the first matching circuits 41 electrically coupled to the power amplifier 42. The second control signal CS2 sent by the processing module 3a uses the control unit 52 to switch the second matching circuits 51 electrically coupled to one of the first matching circuits 41. The control units 44 and 52 including three single pole switches are taken as an example. The number and the type of the control units 44 and 52 are not limited thereto, however, the number of the control units 44 and 52 corresponds to the number of the first matching circuits 41 and the number of the second matching circuits 51, and the control units 44 and 52 may be transistor switches or mechanical switches.

Figure 3:
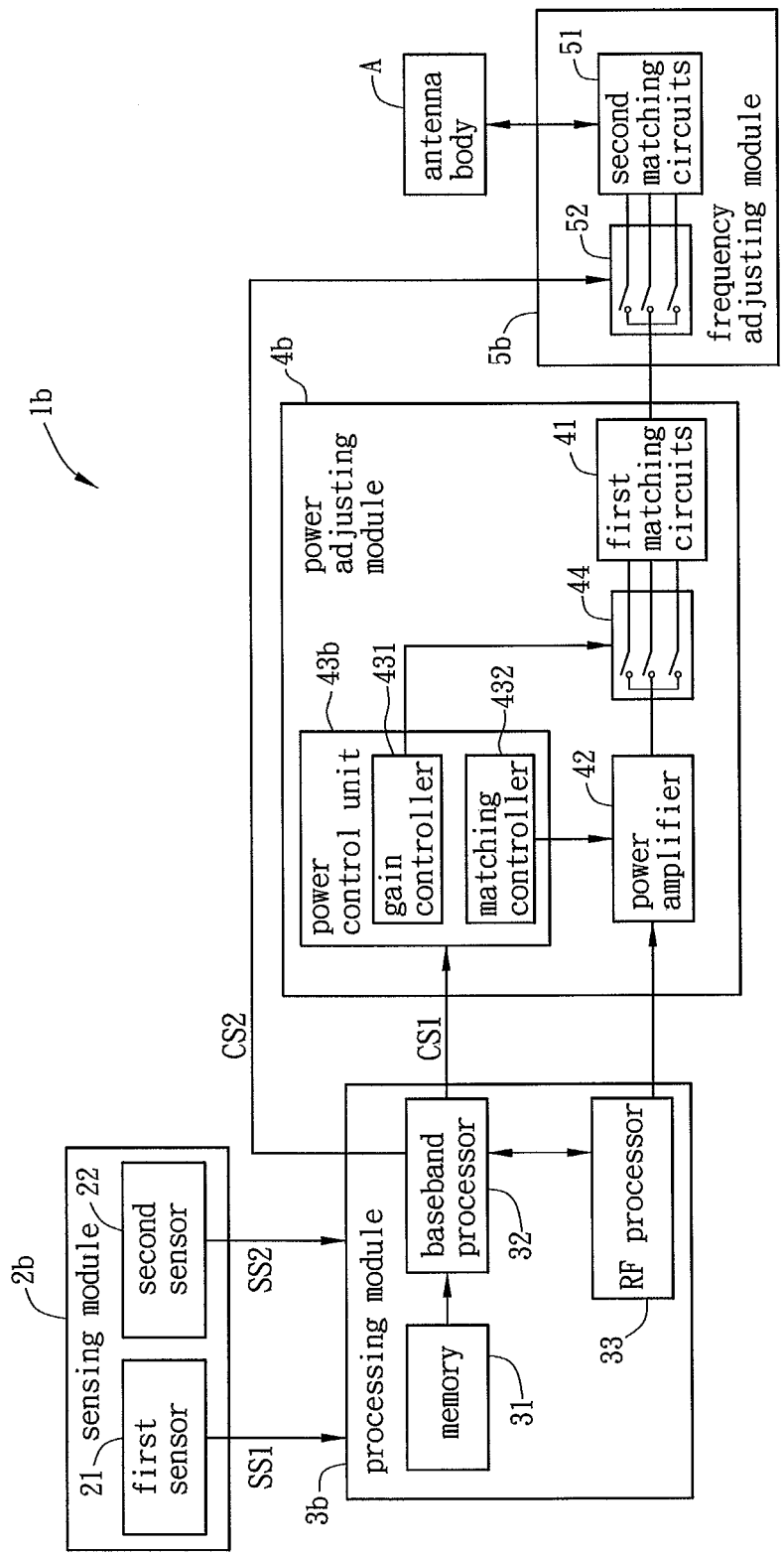
FIG. 3 is a block diagram showing a system of an antenna matching circuit control device in an embodiment.

FIG. 3 is a block diagram showing a system of an antenna matching circuit control device in a second embodiment. The antenna matching circuit control device 1b has a structure similar to the antenna matching circuit control device 1a in FIG. 2. The antenna matching circuit control device 1b is also used with an antenna body A and includes a sensing module 2b, a processing module 3b, a power adjusting module 4b and a frequency adjusting module 5b. The processing module 3b further includes a memory 31, a baseband processor 32 and a RF processor 33. The baseband processor 32 is coupled to the memory 31 and the power control unit 43b, and the RF processor 33 is coupled to the baseband processor 32 and the power amplifier 42.

The memory 31 may be a read-only memory (ROM), a random-access memory (RAM) or other data storages to memorize a check table. The check table including a reference data for determination over the first sensing signal SS1 to obtain whether the object is a human body, and a correspondence among the second sensing signal, the corresponding first control signal and the corresponding second control signal. For example, the correspondence may be different set of second sensing signal SS2 and optimized first control signal CS1 and second control signal CS2 corresponding to the second sensing signal SS2. Such that the processing module 3b may determine an optimized value of the first and second control signals CS1, CS2 to make sure a strength of output electromagnetic wave have a better communication quality with low human body affecting.

In an embodiment, the first sensor 21 is an IR detection device, and the second sensor 22 is an optical sensor. The first sensor 21 detects whether an approaching object is a human body and outputs corresponding first sensing signals SS1 to the baseband processor 32. The second sensor 22 outputs different second sensing signals SS2 to the baseband processor 32 according to the detected light reflection. The baseband processor 32 receives the first sensing signal SS1, and refers to the reference data of the check table of the memory 31 to determine whether the approaching object is a human body. If the object is a human body, the baseband processor 32 searches for corresponding data from the memory 31 after it receives the second sensing signal SS2, it processes the second sensing signal SS2 and transmits the first control signal CS1 to the power control unit 43b, and transmits the second control signal CS2 to the control unit 52 according to the determination between the first control signal CS1, the second control signal CS2 and the second sensing signal SS2 of the memory 31. If the baseband processor 32 determines that the object is not a human body after it searches for corresponding data from the memory 31 and analyzes the first sensing signal SS1, the first control signal CS1 and the second control signal CS2 would not be transmitted.

Through comparing the final output signal value to a preset value, a feedback value defined according to actual communication state, or a calibration value after an actually measure of the electromagnetic wave SAR, the first control signal CS1 and the second control signal CS2 is adjusted by process module 3a.

The RF processor 33 converts a RF signal received by the antenna body A to a baseband signal or converts a baseband signal to a RF signal. The RF signal to be amplified is transmitted to the power amplifier 42, and finally the amplified signal is sent out via the antenna body A. Except for transmitting the first control signal CS1 and the second control signal CS2, the baseband processor 32 also receives, transmits and processes the baseband signal.

Moreover, the power control unit 43b of the power adjusting module 4b includes a gain controller 431. The gain controller 431 controls every level gain of the power amplifier 42 according to the first control signal CS1. The power control unit 43b may adjust output power via the gain controller 431 to reduce the electromagnetic wave SAR when a human approaches or contacts. The power control unit 43b further includes a matching controller 432 to control a load impedance of the power amplifier 42 and control the control unit 44 to control the first matching circuits 41 according to the first control signal CS1.

The power control unit 43b may include one of or both of the gain controller 431 and the matching controller 432 to achieve a power control function. However, in an embodiment, the power control unit 43b may only include the matching controller 432. Thus, the power control unit 43b does not need to be coupled to the power amplifier 42, and it only needs to control the control unit 44 to control the matching controller 432 to change the output power of the power amplifier 42.

As stated above, the antenna matching circuit control device prevents the object such as a human body from exposing in massive electromagnetic wave energy via changing output power of the power amplifier to optimize the output electromagnetic wave strength to reduce the electromagnetic wave SAR. Meanwhile, the antenna matching circuit control device may also avoid the frequency drift of the antenna body and the body effect on the communication quality of the wireless communication device by switching the second matching circuits.

Although the present invention has been described in considerable detail with reference to certain preferred embodiments thereof, the disclosure is not for limiting the scope. Persons having ordinary skill in the art may make various modifications and changes without departing from the scope. Therefore, the scope of the appended claims should not be limited to the description of the preferred embodiments described above.

What is claimed is:

1. An antenna matching circuit control device cooperating with an antenna body comprising:
    a sensing module sensing an object approaching the antenna body and outputting a sensing signal accordingly;
    a processing module coupled to the sensing module and outputting a first control signal and a second control signal according to the sensing signal;
    a power adjusting module coupled to the processing module and adjusting an output power according to the first control signal; and
    a frequency adjusting module coupled to the antenna body and the power adjusting module and adjusting operating frequency of the antenna body according to the second control signal.

2. The antenna matching circuit control device according to claim 1, wherein the power adjusting module controls a power amplifier to couple with one of a plurality of first matching circuits; and the frequency adjusting module controls one of a plurality of second matching circuits to couple with one of the first matching circuits.

3. The antenna matching circuit control device according to claim 1, wherein the sensing module has a first sensor to sense an object that approaching the antenna body and accordingly outputs a first sensing signal; and a second sensor to sense a distance between the antenna body and the object, and output a second sensing signal accordingly.

4. The antenna matching circuit control device according to claim 2, wherein the processing module further includes a memory for memorizing a check table including a reference data for determination over the first sensing signal to obtain whether the object is a human body, and a correspondence among the second sensing signal, the corresponding first control signal and the corresponding second control signal.

5. The antenna matching circuit control device according to claim 4, wherein the processing module further comprises:

a baseband processor coupled to the memory and outputting the first control signal and the second control signal according to the correspondence to output the first control signal and the second control signal; and a radio frequency (RF) processor coupled to the baseband processor and the power amplifier, receiving a baseband signal from the baseband processor, converting the baseband signal to a RF signal, and transmitting the RF signal to the power amplifier.

6. The antenna matching circuit control device according to claim 2, wherein the power adjusting module includes a power control unit coupled to the power amplifier, and the power control unit controls the power amplifier to be coupled to one of the first matching circuits according to the first control signal.

7. The antenna matching circuit control device according to claim 6, wherein the power control unit further includes a gain controller controlling gain of the power amplifier according to the first control signal.

8. The antenna matching circuit control device according to claim 6, wherein the antenna matching circuit control device further includes two control units for controlling the first matching circuits and the second matching circuits, and the two control units are disposed between the power amplifier and the first matching circuits and between the first matching circuits and the second matching circuits, respectively.

9. The antenna matching circuit control device according to claim 8, wherein the power control unit further includes a matching controller controlling one of the control units to control the first matching circuits according to the first control signal.

10. The antenna matching circuit control device according to claim 8, wherein the second control signal selectively controls the second matching circuits via one of the control units.

11. The antenna matching circuit control device according to claim 1, wherein the sensing module includes a first sensor and a second sensor, the first sensor is an infrared ray (IR) temperature detecting device, the second sensor is an optical sensor or a proximity sensor, and the first sensor and the second sensor are disposed at a casing of an electronic device.

* * * * *